(12) United States Patent
Takeoka et al.

(10) Patent No.: US 7,629,185 B2
(45) Date of Patent: Dec. 8, 2009

(54) SEMICONDUCTOR LASER DEVICE MANUFACTURING METHOD AND SEMICONDUCTOR LASER DEVICE

(75) Inventors: Tadashi Takeoka, Mihara (JP); Takuroh Ishikura, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 434 days.

(21) Appl. No.: 11/268,735

(22) Filed: Nov. 8, 2005

(65) Prior Publication Data

US 2006/0121633 A1    Jun. 8, 2006

(30) Foreign Application Priority Data

Nov. 9, 2004   (JP)   ............................. P2004-325225

(51) Int. Cl.
    *H01L 21/66* (2006.01)
(52) U.S. Cl. ........................... 438/15; 438/26; 438/466;
        257/E21.521; 257/E21.522; 257/E21.525;
        257/E21.529; 257/E21.53; 257/E21.531
(58) Field of Classification Search .................... 438/15,
        438/26, 466; 372/43.01; 257/E21.521, E21.522,
        257/E21.525, E21.529, E21.53, E21.531
    See application file for complete search history.

(56) References Cited

U.S. PATENT DOCUMENTS 4,817,849 A * 4/1989 Yamamoto et al. .......... 228/103

FOREIGN PATENT DOCUMENTS

| JP | 4-184175 | 7/1992 |
|----|----------|--------|
| JP | 5-275813 | 10/1993 |
| JP | 10-321685 | 12/1998 |

* cited by examiner

*Primary Examiner*—Laura M Menz
*Assistant Examiner*—Colleen E Snow
(74) *Attorney, Agent, or Firm*—Morrison & Foerster LLP

(57) ABSTRACT

A semiconductor laser device manufacturing method includes, sequentially, a first aging step S1, a first inspection step S2, a mounting step S3, a second aging step S4 and a second inspection step S5. Since the first aging step S1 on a semiconductor laser chip with a high-temperature direct current conduction is performed before the mounting step S3, threshold current and drive current of the semiconductor laser chip before mounting can be reduced.

6 Claims, 15 Drawing Sheets

SEMICONDUCTOR LASER DEVICE MANUFACTURING METHOD AND SEMICONDUCTOR LASER DEVICE

This nonprovisional application claims priority under 35 U.S.C. §119(a) on Patent Application No. 2004-325225 filed in Japan on Nov. 9, 2004, the entire contents of which are hereby incorporated by reference.

BACKGROUND OF THE INVENTION

The present invention relates to a semiconductor laser device manufacturing method as well as a semiconductor laser device.

A conventional semiconductor laser device manufacturing method, as shown in FIG. 13, includes a first inspection step S101, a mounting step S102, a burn-in step or aging step S103, and a second inspection step S104 (see JP 4-184175 A).

At the first inspection step S101, a threshold current value of the semiconductor laser chip is inspected. More specifically, as shown in FIG. 14, a pulse current of 150 mA is passed every 1 ms for 1 µs through the semiconductor laser chip at an atmospheric temperature of room temperature (about 25° C.). Then, as shown in FIG. 15, optical output and current characteristics of the semiconductor laser chip are determined to determine a threshold current Ith and a drive current Iop. Then, the semiconductor laser chip is subjected to a screening by a criterion that if its threshold current Ith and drive current Iop respectively are equal to or lower than specified values, the semiconductor laser chip is decided as a conforming article, and that if its threshold current Ith or drive current Iop exceeds the specified value, the semiconductor laser chip is decided as a nonconforming article.

At the mounting step S102, the semiconductor laser chip that has undergone the first inspection step S101 is mounted onto a package.

At the aging step S103, the mounted semiconductor laser chip is put into conduction at an atmospheric temperature of 70° C., which is not higher than the storage temperature, so that the drive current for the semiconductor laser chip is stabilized. More specifically, as shown in FIG. 16, the drive current Iop is passed through the semiconductor laser chip at the atmospheric temperature of 70° C. so that the optical output of the semiconductor laser chip becomes 100 mW. The vertical axis represents the drive current Iop, and the horizontal axis represents conduction time.

As shown in FIG. 16, the drive current for the semiconductor laser chip increases once after the start of the conduction, and then decreases to approach a certain value. The state that the drive current increases is referred to as a degradation phenomenon, and the state that the drive current decreases is referred to as an upgrade phenomenon.

Thus, in the aging step S103, the semiconductor laser chip, if it does not upgrade but degrade, is removed as a nonconforming article, while the semiconductor laser chip is upgraded to some extent to achieve a stabilization of the drive current for the semiconductor laser chip.

At the second inspection step S104, as in the first inspection step S101, the threshold current Ith and the drive current Iop of the semiconductor laser chip are inspected.

However, with this conventional manufacturing method for semiconductor laser chips, it would take as long a time as about 10 to 20 hours so that the drive current for the semiconductor laser chips is stabilized in the aging step S103.

Also, the aging step (burn-in step) S103 is performed for the first time after the mounting step S102, and the second inspection step S104 is performed thereafter. Therefore, upon incidence of a nonconforming article, not only the semiconductor laser chip but also the package or system or the like would inevitably be discarded. This would cause wasteful component parts to increase, posing such problems as higher cost of the semiconductor laser device and worse yields.

Furthermore, the aging step (burn-in step) S103 subsequent to the mounting step S102 takes about 10 to 20 hours, causing worse throughput. Therefore, the actual case would be that semiconductor laser devices, which have been upgraded to such an extent as to be free from occurrence of considerable problems, are taken as conforming articles and shipped, in consideration of the manufacturing cost.

SUMMARY OF THE INVENTION

Accordingly, an object of the present invention is to provide a semiconductor laser device manufacturing method capable of manufacturing semiconductor laser devices free from variations in drive current with high throughput, low cost and a good yield, as well as to provide a semiconductor laser device of low cost free from characteristic variations.

In order to achieve the above object, according to the present invention, there is provided a semiconductor laser device manufacturing method comprising:

a first aging step for passing a direct current through a semiconductor laser chip for a set time period at a set atmospheric temperature not lower than a storage temperature; and a mounting step for mounting the semiconductor laser chip that has undergone the first aging step.

It is noted here that the storage temperature refers to an atmospheric temperature at which the semiconductor laser device can be stored without any failures. A maximum value of the storage temperature is, for example, about 150° C.

According to the semiconductor laser device manufacturing method of the present invention, since the first aging step is performed on the before-mounting semiconductor laser chip, electrical characteristics of the before-mounting semiconductor laser chip such as reduction of threshold current and drive current can be improved. Then, the number of nonconforming articles after the mounting of the semiconductor laser chip can be reduced, wasteful component parts can be reduced. Thus, a semiconductor laser device free from variations in drive current can be manufactured with a good yield. Also, the time required for performing any other aging step on the after-mounting semiconductor laser chip can be can be shortened or omitted, making it practicable to manufacture a semiconductor laser device with high throughput and low cost.

In one embodiment, the set atmospheric temperature and the set time period are so set that the semiconductor laser chip substantially does not undergo a degradation phenomenon or an upgrade phenomenon after the first aging step.

It is noted here that the degradation phenomenon refers to a phenomenon that the drive current with which the semiconductor laser chip produces a rated optical output increases with a lapse of time. Also, the upgrade phenomenon refers to a phenomenon that the drive current with which the semiconductor laser chip produces a rated optical output decreases with a lapse of time.

In this embodiment, since the semiconductor laser chip can be substantially prevented from occurrence of any degradation phenomenon and upgrade phenomenon after the first aging step, it becomes omittable to perform other aging steps on the after-mounting semiconductor laser chip. Besides, the yield of the semiconductor laser device becomes even better.

In one embodiment, the set atmospheric temperature is 170 to 300° C.

In this embodiment, since the set atmospheric temperature is 170 to 300° C., the semiconductor laser chip can be made substantially free from occurrence of the degradation phenomenon and the upgrade phenomenon after the first aging step, thus making it omittable to perform any other aging step on the after-mounting semiconductor laser chip. Besides, the yield of the semiconductor laser device becomes even better.

More specifically, if the set atmospheric temperature goes beyond 300° C., the semiconductor laser chip undergoes damage due to heat. On the other hand, if the set atmospheric temperature becomes lower than 170° C., the semiconductor laser chip undergoes the degradation phenomenon and the upgrade phenomenon after the first aging step.

In one embodiment, the set time period is 0.5 second to 5 minutes.

In this embodiment, since the set time period is 0.5 sec. to 5 min., the semiconductor laser chip can be made substantially free from occurrence of the degradation phenomenon and the upgrade phenomenon after the first aging step, thus making it omittable to perform any other aging step on the after-mounting semiconductor laser chip. Besides, the yield of the semiconductor laser device becomes even better.

More specifically, if the set time period goes beyond 5 minutes, the throughput decreases. On the other hand, if the set time period becomes less than 0.5 second, the semiconductor laser chip undergoes the degradation phenomenon and the upgrade phenomenon after the first aging step.

One embodiment further comprises a first inspection step for inspecting at least one of threshold current and drive current of the semiconductor laser chip after the first aging step and before the mounting step.

It is noted here that the threshold current refers to a current value involved when laser light starts being outputted. The drive current refers to a current value necessary to obtain a desired optical output (rated output).

In this embodiment, since the first inspection step is performed after the first aging step, the yield of the semiconductor laser chips can be improved by performing the first inspection step after the threshold current, drive current and other characteristics of the semiconductor laser chip are improved. Further, since the first inspection step is performed before the mounting step, the packages and the stems and the like are not included in nonconforming articles which are excluded in the first inspection step, thus eliminating the wasting of the packages and the stems and the like.

One embodiment further comprises a second aging step for, after the mounting step, passing a current through the semiconductor laser chip at an atmospheric temperature not lower than the storage temperature; and a second inspection step for inspecting at least one of threshold current and drive current of the semiconductor laser chip after the second aging step.

In this embodiment, since the second aging step is performed after the mounting step, the drive current for the semiconductor laser chip can be stabilized with reliability. Besides, performing the second aging step makes it possible to distinguish nonconforming semiconductor laser devices in advance, so that semiconductor laser devices of high reliability can be realized.

One embodiment further comprises a second inspection step for inspecting at least one of threshold current and drive current of the semiconductor laser chip without performing any other aging step and immediately after the mounting step.

In this embodiment, since the second inspection step is performed without performing any other aging step and immediately after the mounting step, the man-hours can be reduced. Also, it is no longer necessary to use such large-sized equipment for performing the aging (burn-in) of the semiconductor laser chip together with the package and the stems as would be involved in the prior art.

In one embodiment, the first aging step is performed on the semiconductor laser chips of a laser bar which is composed of a plurality of the semiconductor laser chips which are arrayed.

In this embodiment, since the first aging step is performed on the semiconductor laser chips of the laser bar, it becomes possible to perform the first aging step for a plurality of semiconductor laser chips simultaneously or divisionally in a specified number of times, allowing the working time to be shortened.

According to the present invention, there is also provided a semiconductor laser device having a semiconductor laser chip, wherein in a state that the semiconductor laser chip produces a rated optical output immediately after a product completion after mounting, an absolute value of a difference between a first drive current at a start of conduction and a second drive current immediately after a lapse of 20 hours after the start of the conduction is within 1.0 mA.

In this semiconductor laser device of the invention, since the absolute value of the difference between the first drive current and the second drive current is within b 1.0 mA, variations in the first drive current and the second drive current are lessened.

Thus, the drive current for the semiconductor laser chip is generally stabilized, so that the reliability of the semiconductor laser device is improved. Therefore, a semiconductor laser device of low cost free from characteristic variations can be realized.

Further, according to the present invention, there is provided a semiconductor laser device having a semiconductor laser chip, wherein in a state that the semiconductor laser chip produces a rated optical output immediately after a product completion after mounting, a ratio of a first drive current at a start of conduction to a second drive current immediately after a lapse of 20 hours after the start of the conduction is 98% to 102%.

In this semiconductor laser device of the invention, since the ratio of the first drive current to the second drive current is 98% to 102%, a difference between the first drive current and the second drive current are lessened.

Thus, the drive current for the semiconductor laser chip is generally stabilized, so that the reliability of the semiconductor laser device is improved. Therefore, a semiconductor laser device of low cost free from characteristic variations can be realized.

In one embodiment, the semiconductor laser chip has been subjected to 0.5 second to 5 minute conduction of a direct current at an atmospheric temperature of 170 to 300° C., which is not lower than a storage temperature.

In this embodiment, since the semiconductor laser chip has been subjected to high temperature DC conduction, electrical characteristics of the semiconductor laser chip such as threshold current and drive current have been improved with reliability.

According to the semiconductor laser device manufacturing method of the present invention, since the first aging step is performed on the before-mounting semiconductor laser chip, a semiconductor laser device free from variations in drive current can be manufactured with high throughput, low cost and a good yield.

Also, according to the semiconductor laser device of the present invention, since the absolute value of the difference between the first drive current and the second drive current is within 1.0 mA, a semiconductor laser device of low cost free from characteristic variations can be realized.

Furthermore, according to the semiconductor laser device of the present invention, since the ratio of the first drive current to the second drive current is 98% to 102%, a semiconductor laser device of low cost free from characteristic variations can be realized.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the present invention is described in detail by way of embodiments thereof illustrated in the accompanying drawings.

First Embodiment

Figure 1:
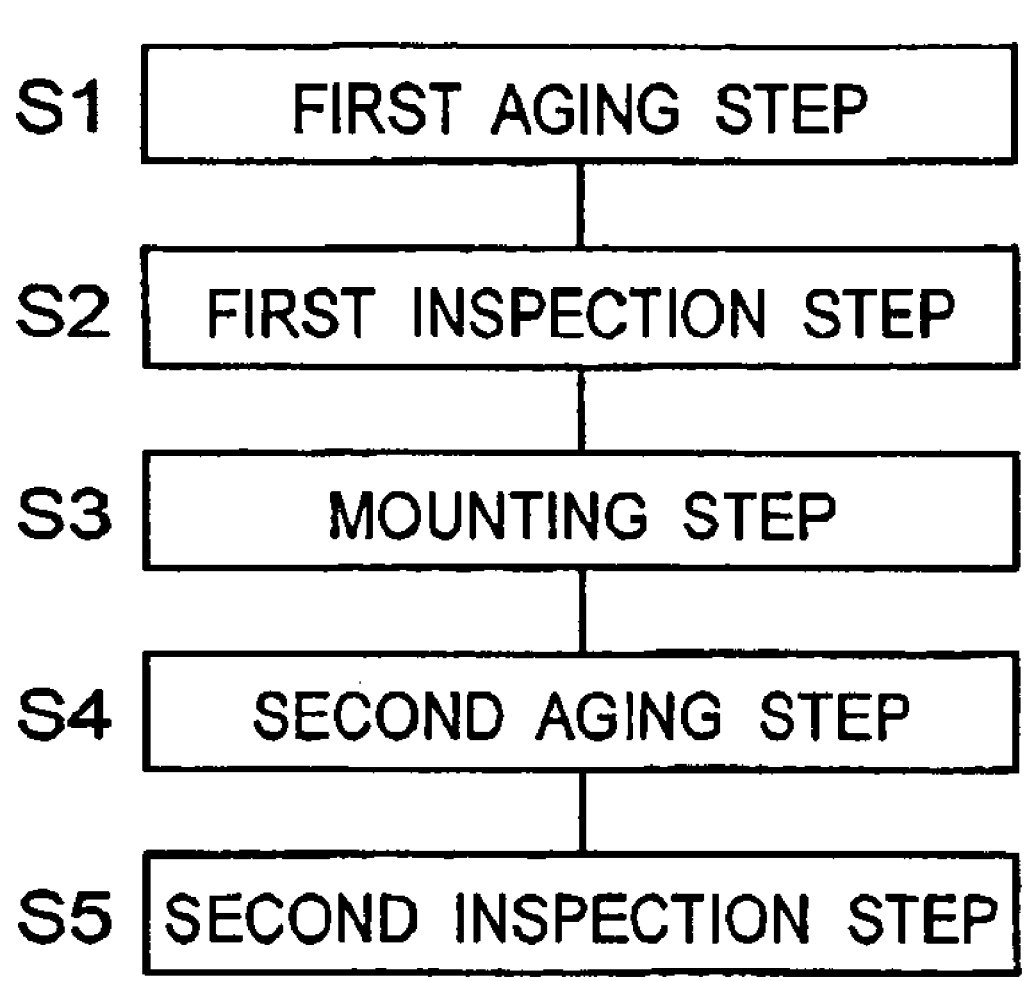
FIG. 1 is a flowchart showing one embodiment of a semiconductor laser device manufacturing method according to the present invention.

FIG. 1 shows a flowchart of one embodiment of the semiconductor laser device manufacturing method according to the present invention. This semiconductor laser device manufacturing method includes, sequentially, a first aging step S1, a first inspection step S2, a mounting step S3, a second aging step S4 and a second inspection step S5.

At the first aging step S1, a direct current is passed through the semiconductor laser chip for a set time period at a set atmospheric temperature not lower than a storage temperature. The first aging step S1 is a so-called high temperature DC conduction step.

The storage temperature refers to an atmospheric temperature at which the semiconductor laser device can be stored without any failures. A maximum value of the storage temperature is, for example, about 150° C.

The set atmospheric temperature and the set time period are so set that the semiconductor laser chip substantially does not undergo the degradation phenomenon or the upgrade phenomenon after the first aging step. The set atmospheric temperature is 170 to 300° C. The set time period is 0.5 second to 5 minutes.

Figure 2:
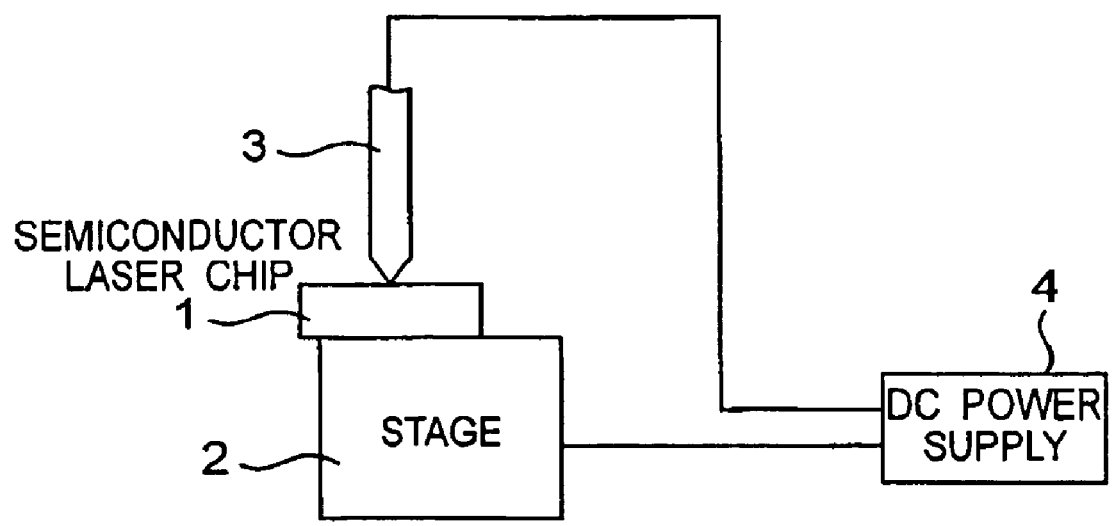
FIG. 2 is a structural view showing equipment for performing a first aging step.

More specifically, as shown in FIG. 2, with the semiconductor laser chip 1 placed on a stage 2, and with a probe 3 set in contact with the semiconductor laser chip 1, a direct current is passed through the semiconductor laser chip 1 from a DC power supply 4 electrically connecting with the stage 2 and the probe 3.

Figure 3:
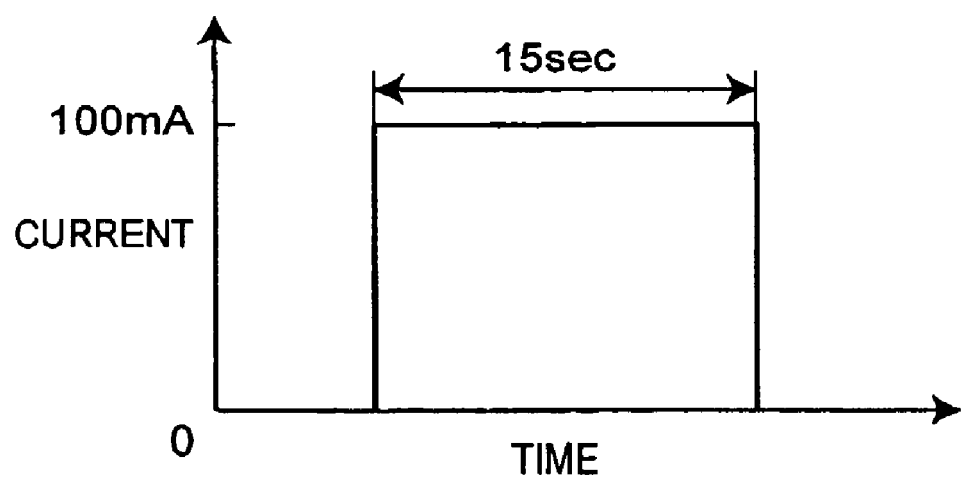
FIG. 3 is a graph showing a relationship between current and time in the first aging step.

When this is done, the set atmospheric temperature is, for example, about 250° C. Also, as shown in FIG. 3, the direct current from the DC power supply 4 is about 100 mA and the set time period is about 15 sec.

Further, the equipment for performing the first aging step S1 has, in terms of its size, only to accommodate the semiconductor laser chip, and so can be provided in a small size.

At the first inspection step S2, at least one of threshold current Ith and drive current Iop before the mounting is inspected after the first aging step S1.

It is noted here that the threshold current Ith refers to a current value involved when laser light starts being outputted. The drive current Iop refers to a current value necessary to obtain a desired optical output (rated output).

Figure 14:
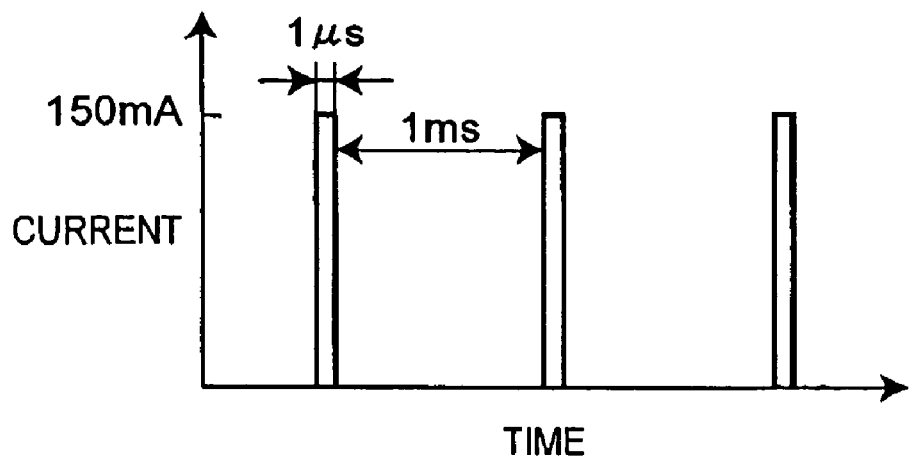
FIG. 14 is a graph showing a relationship between current and time in a first inspection step of the prior art.
Figure 15:
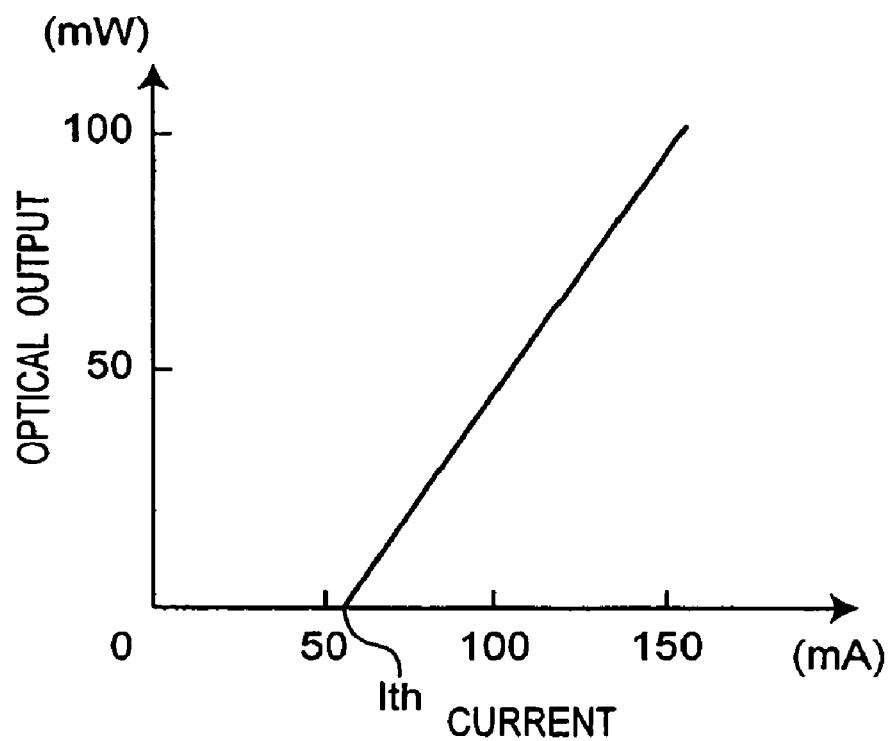
FIG. 15 is a graph showing a relationship between optical output and current in the semiconductor laser device of the prior art.

More specifically, a pulse current is passed through the semiconductor laser chip at an atmospheric temperature not higher than the storage temperature. For example, in the same manner as in the prior art example shown in FIG. 14, an electric current flow of 150 mA is passed every 1 ms for 1 μs at an atmospheric temperature of room temperature (about 25° C.).

Then, optical output and current characteristics of the semiconductor laser chip are determined to determine the threshold current Ith. Then, the semiconductor laser chip is subjected to a screening by a criterion that if its threshold current Ith is equal to or lower than a specified value, the semiconductor laser chip is decided as a conforming article, and that if its threshold current Ith exceeds the specified value, the semiconductor laser chip is decided as a nonconforming article.

At the mounting step S3, the semiconductor laser chip that has undergone the first inspection step S2 and been decided as a conforming article is mounted onto a mounting member (not shown) such as a package, stem and the like.

At the second aging step S4, subsequent to the mounting step S3, the semiconductor laser chip is put into conduction at an atmospheric temperature not higher than the storage temperature to achieve a stabilization of the drive current Iop for the semiconductor laser chip. The second aging step S4 is a so-called screening step or burn-in step.

Figure 4:
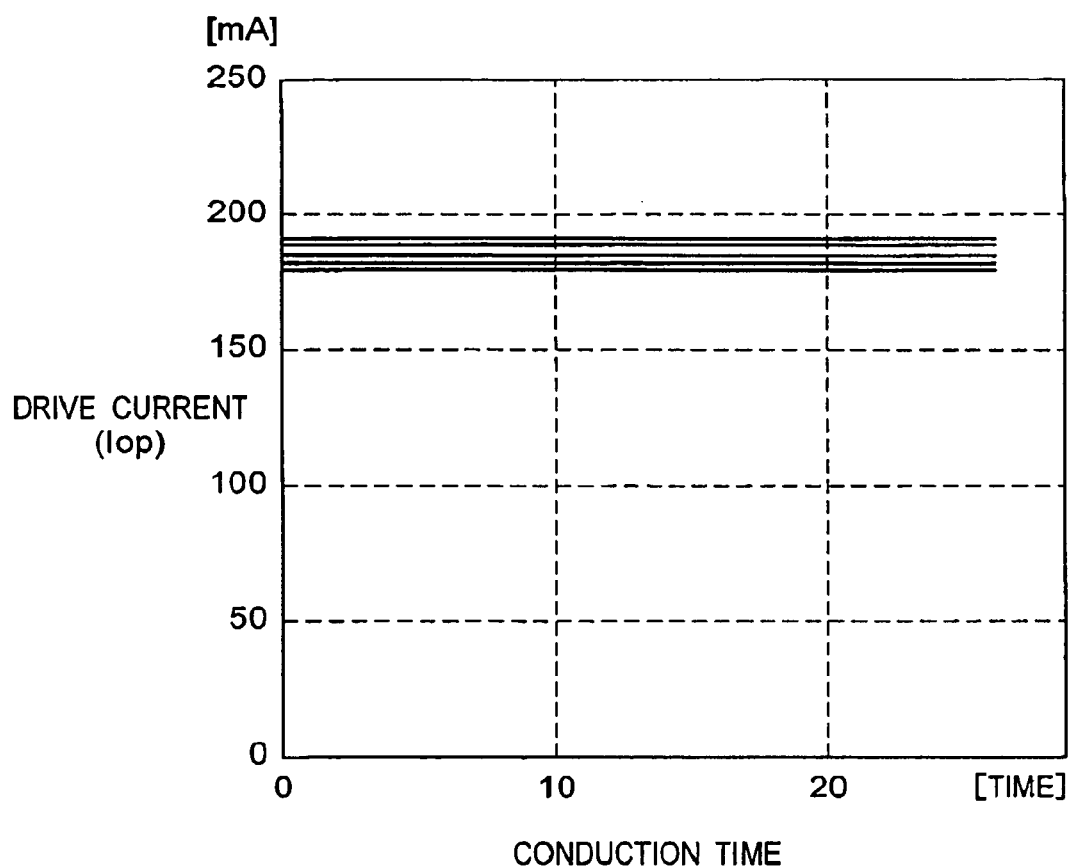
FIG. 4 is a graph showing a relationship between drive current and conduction time in a second aging step.

More specifically, as shown in FIG. 4, the drive current is passed through the semiconductor laser chip at an atmospheric temperature of 70° C. so that the optical output of the semiconductor laser chip becomes 100 mW. The vertical axis represents the drive current Iop, and the horizontal axis represents conduction time.

Figure 16:
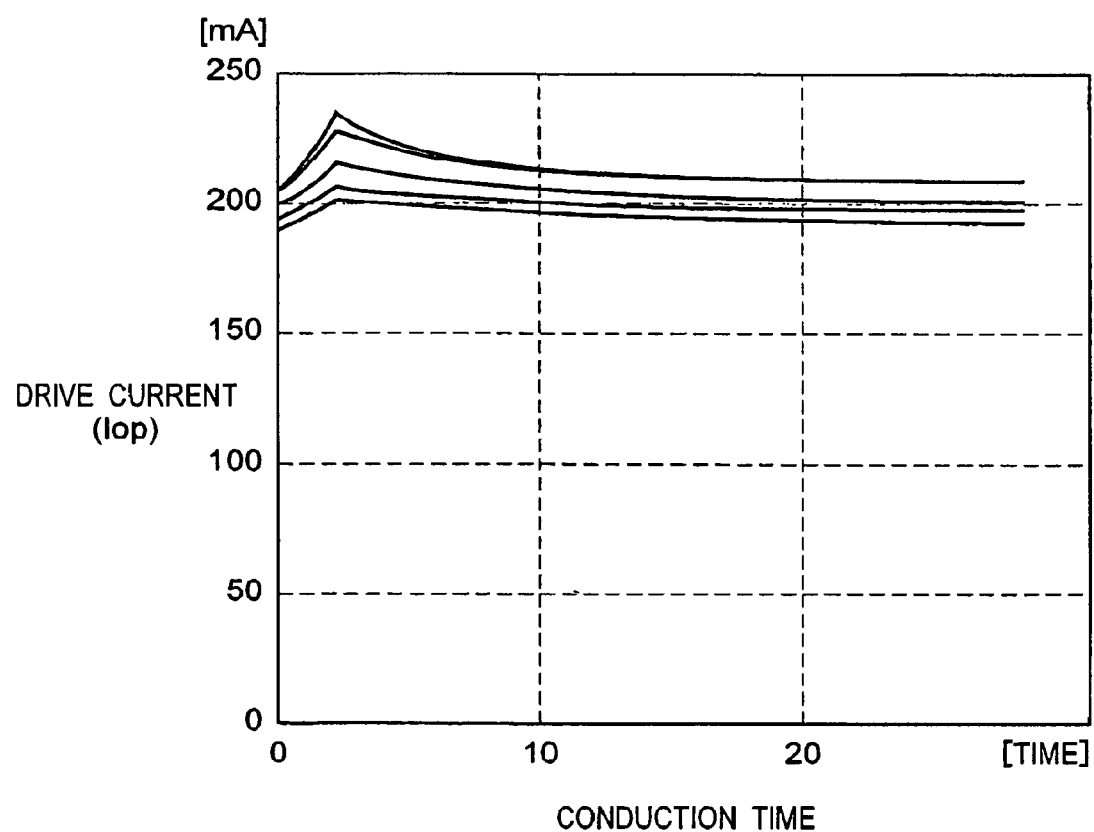
FIG. 16 is a graph showing a relationship between drive current and conduction time in the aging step of the prior art.

In this case, as shown in FIG. 16 of the prior art example, the drive current for the semiconductor laser chip increases once after the start of the conduction, and then decreases to approach a certain value. The state that the drive current increases is referred to as a degradation phenomenon, and the state that the drive current decreases is referred to as an upgrade phenomenon.

Thus, in the second aging step S4, as its aim, the semiconductor laser chip, if it does not upgrade but degrade, is removed as a nonconforming article, while the semiconductor laser chip that upgrades is subjected to a stabilization of the drive current therefor.

At the second inspection step S5, subsequent to the second aging step S4, the threshold current Ith, the drive current Iop, radiation light of the laser light or the like are measured with a direct current which is conditioned nearly by actual time of use, as in the first inspection step S2.

Thus, there is provided a semiconductor laser device including the semiconductor laser chip 1, and the mounting member.

According to this semiconductor laser device manufacturing method, since the first aging step S1 is performed on the before-mounting semiconductor laser chip, the time for performing the second aging step S4 on the mounted semiconductor laser chip is cut down.

In more detail, the prior art example shown in FIG. 16 would take a conduction time of about 10 to 20 hours for the stabilization of the drive current for the semiconductor laser chip, whereas the present invention takes a conduction time of only about 1 to 4 hours as shown in FIG. 4, thus allowing the conduction time to be largely shortened.

Also, in the execution of the second aging step S4, the number of degrading semiconductor laser chips can be reduced, so that the yield of semiconductor laser chips betters. At the same time, the number of semiconductor laser chips that result in nonconforming articles for the second aging step S4 can be reduced, so that wasting of the packages or the stems included in the nonconforming articles can be prevented.

That is, performing the first aging step S1 on the before-mounting semiconductor laser chip makes it possible to reduce the initial threshold current value of the semiconductor laser chip in the first inspection step S2 as compared with the conventional one. Therefore, the semiconductor laser chip does not undergo any large extent of degradation in the second aging step S4.

Thus, a semiconductor laser device free from variations in drive current can be manufactured with high throughput, low cost and a good yield.

Also, since the set atmospheric temperature is 170 to 300° C., the semiconductor laser chip can be made substantially free from occurrence of the degradation phenomenon and the upgrade phenomenon after the first aging step S1. That is, if the set atmospheric temperature goes beyond 300° C., the semiconductor laser chip undergoes damage due to heat. On the other hand, if the set atmospheric temperature becomes lower than 170° C., the semiconductor laser chip undergoes the degradation phenomenon and the upgrade phenomenon after the first aging step S1.

Further, since the set time period is 0.5 sec. to 5 min., the semiconductor laser chip can be made substantially free from occurrence of the degradation phenomenon and the upgrade phenomenon after the first aging step S1. That is, if the set time period goes beyond 5 minutes, the throughput decreases. On the other hand, if the set time period becomes less than 0.5 second, the semiconductor laser chip undergoes the degradation phenomenon and the upgrade phenomenon after the first aging step S1.

Also, since the first inspection step S2 is performed after the first aging step S1, the yield of the semiconductor laser chips can be improved by performing the first inspection step S2 after the threshold current and other characteristics of the semiconductor laser chip are improved. Further, since the first inspection step S2 is performed before the mounting step S3, the packages and the stems and the like are not included in nonconforming articles which are excluded in the first inspection step S2, thus eliminating the wasting of the packages and the stems and the like.

Furthermore, since the second aging step S4 is included after the mounting step S3, the drive current for the semiconductor laser chip can be stabilized with reliability. Besides, performing the second aging step S4 makes it possible to distinguish nonconforming semiconductor laser devices in advance, so that semiconductor laser devices of high reliability can be realized.

Figure 17:
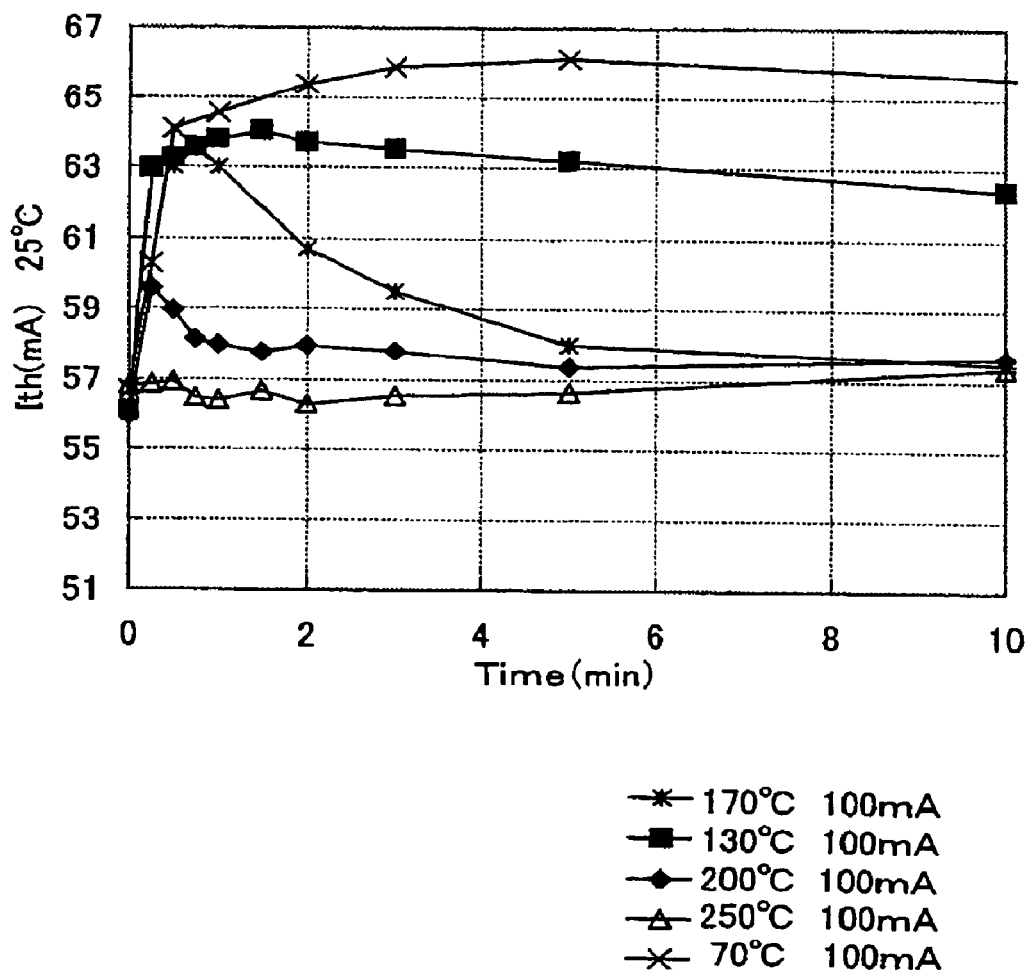
FIG. 17 is a graph showing a relationship between threshold current and conduction time in the first aging step.
Figure 18:
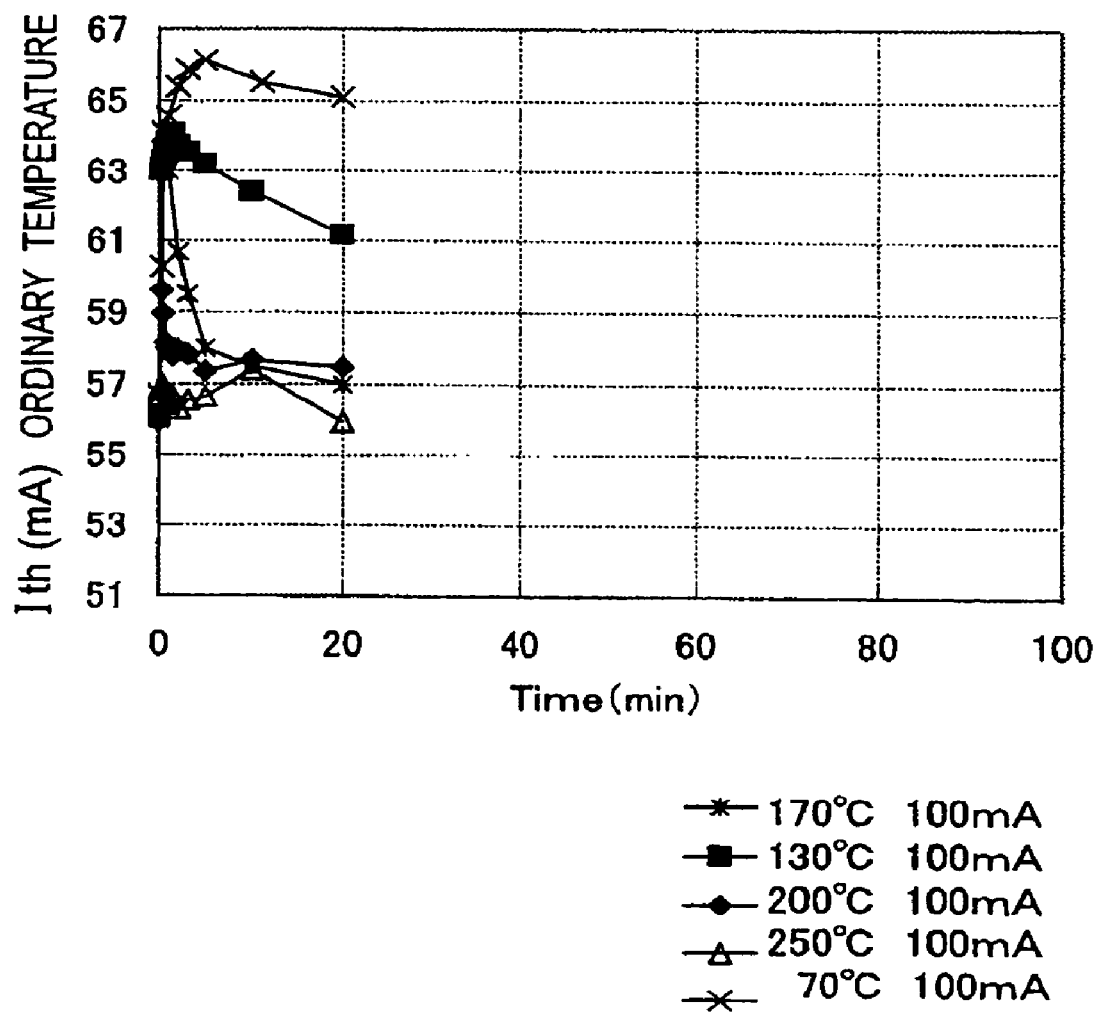
FIG. 18 is a graph showing a relationship between threshold current and conduction time in the first aging step.

In addition, in the first aging step S1, in the passing of the direct current of about 100 mA, the threshold current Ith was checked for its value relative to the conduction time, and its results are shown in FIGS. 17 and 18. FIGS. 17 and 18 are charts in which the horizontal axis represents conduction time and the vertical axis represents the threshold current Ith. FIG. 18 is a chart in which the conduction time of the horizontal axis of FIG. 17 is elongated.

As can be understood from FIGS. 17 and 18, with the set atmospheric temperature as low as 70 to 130° C., the threshold current Ith degrades along with conduction so as to change from 63 to 66 mA against about 56 mA of the initial threshold current Ith, followed by relatively slow progress of subsequent upgrading.

However, after the set atmospheric temperature is further elevated, with the set atmospheric temperature at 170° C., indeed the threshold current Ith degrades, but the upgrading rate becomes higher. As a result of 5 minute conduction, the threshold current Ith is upgraded to a value nearly equal to the initial value.

Also, with the set atmospheric temperature at 200° C., the upgrading rate becomes even higher, while the degradation is lessened concurrently. As a result of about 1 minute conduction, the threshold current Ith is nearly stabilized.

Also, with the set atmospheric temperature at 250° C., both degradation and upgrading go out eventually. As a result of 15 to 30 second conduction, the threshold current Ith becomes stabilized without degradation or upgrading.

Also, with the set atmospheric temperature at 300° C., although not shown, the threshold current Ith becomes stabilized without degradation or upgrading as a result of 0.5 second conduction.

Consequently, in the first aging step S1, the above-described effects can be obtained with conduction of an about 100 mA direct current under the following conditions (1) to (4), respectively:

(1) the set atmospheric temperature is about 170° C. and the set time period is about 5 minutes;

(2) the set atmospheric temperature is about 200° C. and the set time period is about 1 minute;

(3) the set atmospheric temperature is about 250° C. and the set time period is about 15 to 30 seconds;

(4) the set atmospheric temperature is about 300° C. and the set time period is about 0.5 second.

As shown above, in the present invention, since the first aging step S1 is performed before the mounting of the semiconductor laser chip onto the package, the set atmospheric temperature can be set to the storage temperature or higher.

In this connection, in the prior art, since the aging step is performed after the mounting of the semiconductor laser chip onto the package, the atmospheric temperature cannot be set to the storage temperature or higher. In the prior art, if the after-mounting semiconductor laser chip is subjected to the aging step at an atmospheric temperature of the storage temperature or higher, there would occur, for example, melting of Au paste, which is the material for adhesion between the device and the stem, thus resulting in a failure of the semiconductor laser device.

Second Embodiment

Figure 5:
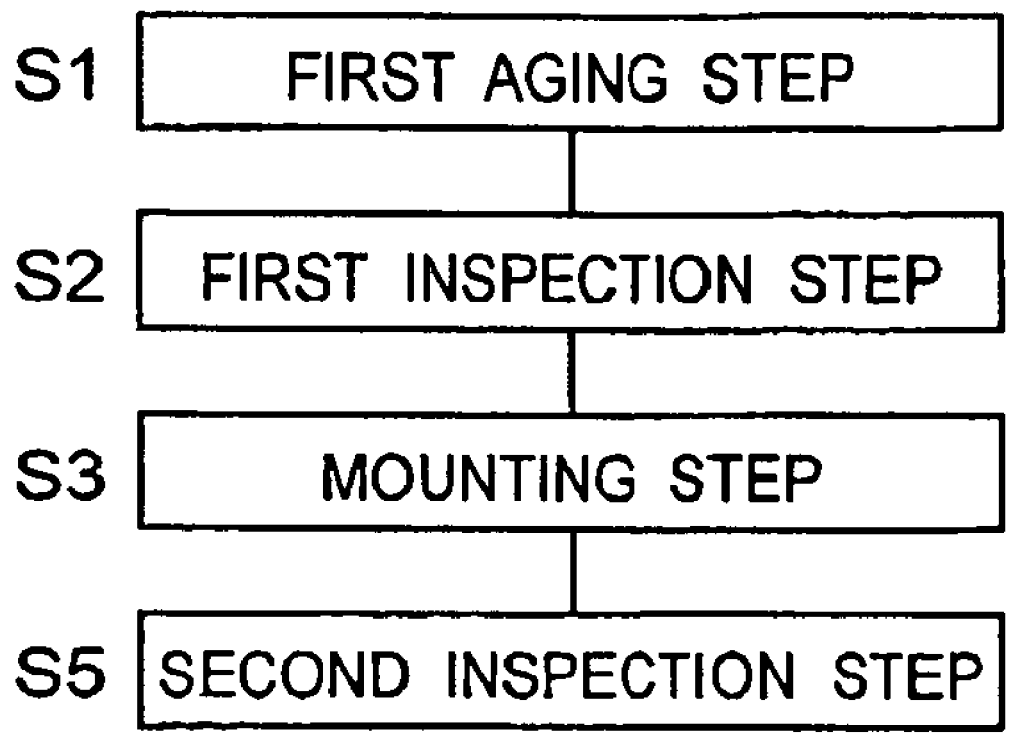
FIG. 5 is a flowchart showing another embodiment of a semiconductor laser device manufacturing method according to the present invention.

FIG. 5 shows a second embodiment of the semiconductor laser device manufacturing method according to the present invention. A difference of the second embodiment from the first embodiment lies only in that the second embodiment does not include the second aging step S4. That is, the second embodiment includes, sequentially, the first aging step S1, the first inspection step S2, the mounting step S3, and second inspection step S5.

Thus, since the second inspection step S5 is performed without performing any other aging step and immediately after the mounting step S3, the man-hours can be reduced. Also, it is no longer necessary to use such large-sized equipment for performing the aging (burn-in) of the semiconductor laser chip together with the package as would be involved in the prior art.

Third Embodiment

Figure 6:
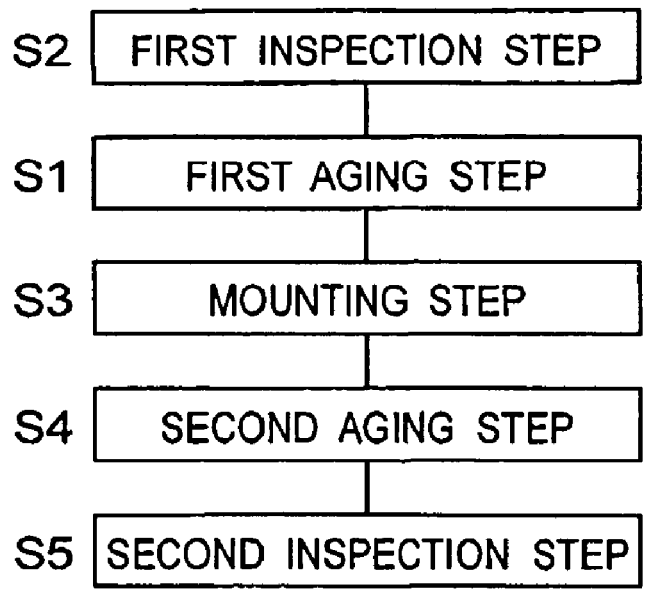
FIG. 6 is a flowchart showing another embodiment of a semiconductor laser device manufacturing method according to the present invention.

FIG. 6 shows a third embodiment of the semiconductor laser device manufacturing method according to the present invention. A difference of this embodiment from the first embodiment lies only in that the first aging step S1 and the first inspection step S2 are reversed in execution sequence in this third embodiment. That is, the third embodiment includes, sequentially, the first inspection step S2, the first aging step S1, the mounting step S3, the second aging step S4, and the second inspection step S5.

Thus, since the first aging step S1 is performed after the execution of the first inspection step S2, nonconforming semiconductor laser chips can be excluded preliminarily.

Fourth Embodiment

Figure 7:
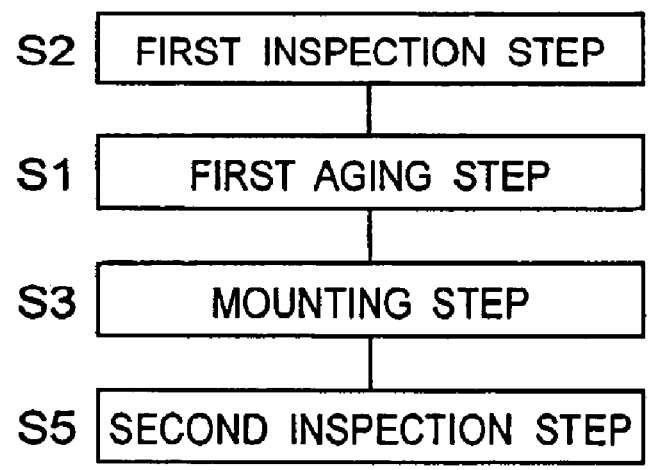
FIG. 7 is a flowchart showing another embodiment of a semiconductor laser device manufacturing method according to the present invention.

FIG. 7 shows a fourth embodiment of the semiconductor laser device manufacturing method according to the present invention. A difference of this fourth embodiment from the third embodiment lies only in that the fourth embodiment does not include the second aging step S4. That is, this fourth embodiment includes, sequentially, the first inspection step S2, the first aging step S1, the mounting step S3, and the second inspection step S5.

Thus, since the second inspection step S5 is performed without performing any other aging step and immediately after the mounting step S3, the man-hours can be reduced. Also, it is no longer necessary to use such large-sized equipment for performing the aging (burn-in) of the semiconductor laser chip together with the package as would be involved in the prior art.

Fifth Embodiment

Figure 8:
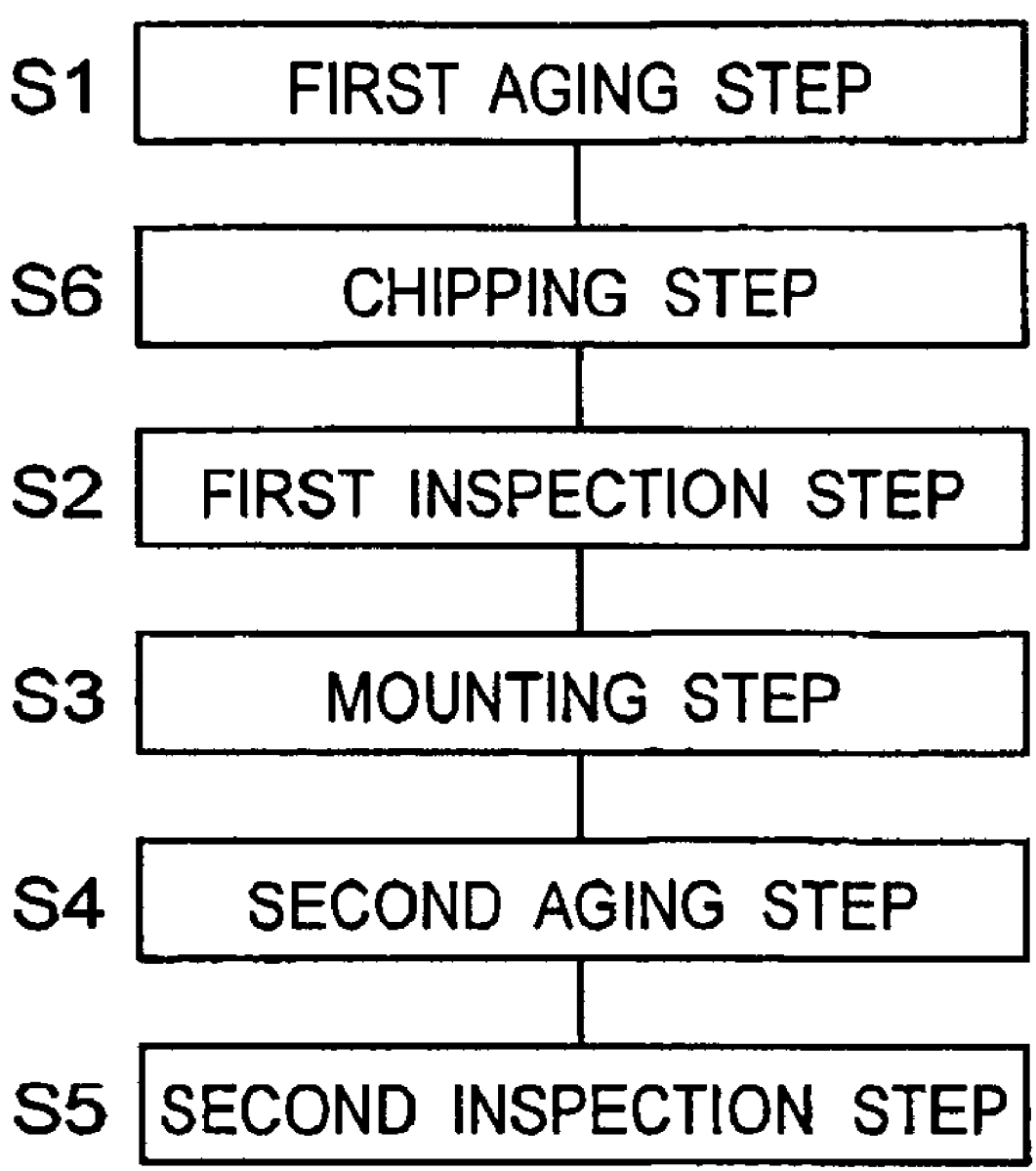
FIG. 8 is a flowchart showing another embodiment of a semiconductor laser device manufacturing method according to the present invention.

FIG. 8 shows a fifth embodiment of the semiconductor laser device manufacturing method according to the present invention. A difference of the fifth embodiment from the first embodiment lies in that the semiconductor laser device is manufactured by aging a laser bar composed of a plurality of ranging semiconductor laser chips before their separation in the fifth embodiment. That is, the fifth embodiment includes, sequentially, a first aging step S1, a chipping step S6, the first inspection step S2, the mounting step S3, the second aging step S4, and the second inspection step S5.

At the first aging step S1, a direct current is passed through the semiconductor laser chips of the laser bar for a set time period at a set atmospheric temperature of the storage temperature or higher.

Figure 9:
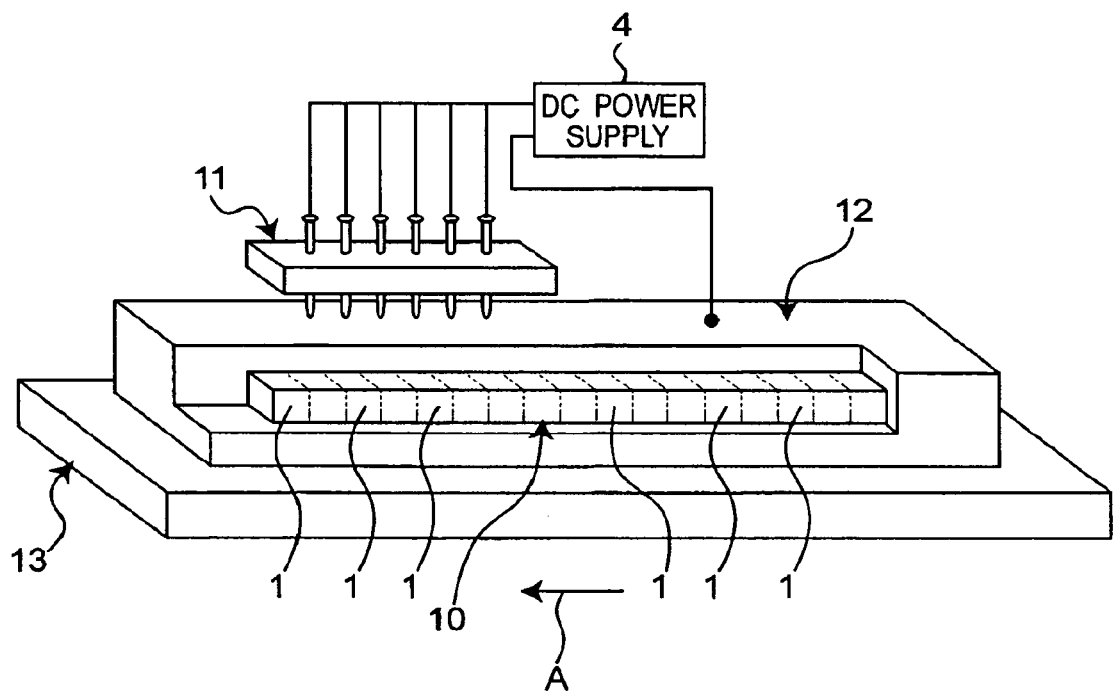
FIG. 9 is a structural view showing equipment for performing a first aging step.

More specifically, as shown in FIG. 9, a laser bar 10 composed of a plurality of ranging semiconductor laser chips 1 is placed on a heater 12. With a probe card 11 brought into contact with the semiconductor laser chips 1, a direct current is passed through the semiconductor laser chips 1 from the DC power supply 4 electrically connecting to the heater 12 and the probe card 11.

In one time conduction by the probe card 11, the conduction is simultaneously effected for a specified number (e.g., 10) of the semiconductor laser chips 1.

In the case where the conduction is performed continuously by the probe card 11, the probe card 11 is once separated from the laser bar 10, and a table 13 on which the heater 12 is placed is moved at a specified pitch along a direction of arrow A, which is the longitudinal direction of the laser bar 10. Then, the probe card 11 is brought into contact with the laser bar 10 once again so as to come into contact with the laser bar 10 to do conduction.

At the chipping step S6, the laser bar 10, which has undergone the first aging step S1, is divided into the plurality of the semiconductor laser chips 1.

Then, the individual semiconductor laser chips 1 are subjected to the first inspection step S2, the mounting step S3, the second aging step S4, and the second inspection step S5.

Thus, since the first aging step S1 is performed on the semiconductor laser chips 1 of the laser bar 10, it becomes possible to perform the first aging step S1 for a plurality of semiconductor laser chips 1 simultaneously or divisionally in a specified number of times, allowing the working time to be shortened.

Sixth Embodiment

Figure 10:
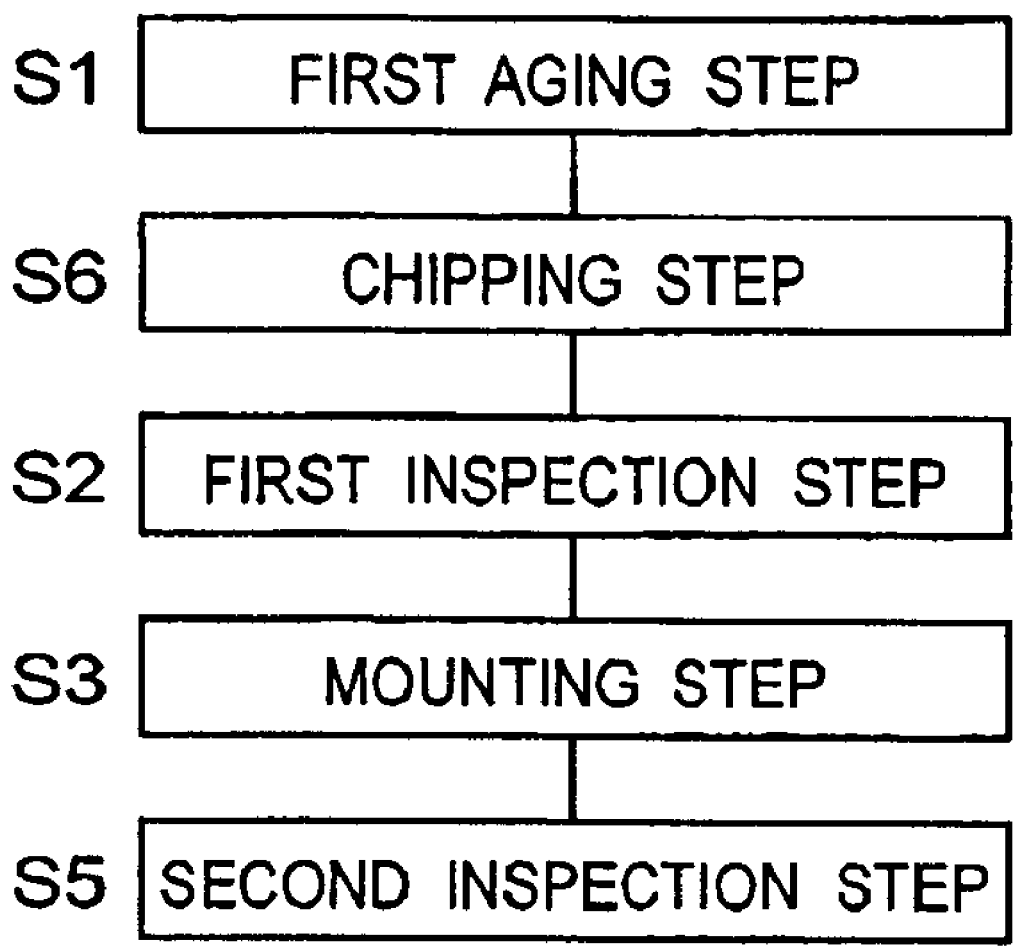
FIG. 10 is a flowchart showing another embodiment of a semiconductor laser device manufacturing method according to the present invention.

FIG. 10 shows a sixth embodiment of the semiconductor laser device manufacturing method according to the present invention. A difference of this embodiment from the fifth embodiment lies in that the sixth embodiment does not include the second aging step S4. That is, the sixth embodiment includes, sequentially, the first aging step S1, the chipping step S6, the first inspection step S2, the mounting step S3, and second inspection step S5.

Thus, since the second inspection step S5 is performed without performing any other aging step and immediately after the mounting step S3, the man-hours can be reduced. Also, it is no longer necessary to use such large-sized equipment for performing the aging (burn-in) of the semiconductor laser chips together with the package as would be involved in the prior art.

Seventh Embodiment

In the case of a semiconductor laser device manufactured by any one of the first to sixth embodiments, the absolute value of the difference between a first drive current at a start of conduction and a second drive current resulting 20 hours after the start of the conduction is within 1.0 mA in the state that the semiconductor laser chip produces a rated optical output immediately after the product completion after the mounting.

It is noted here that the start of conduction refers to a first-time conduction or current passing through the semiconductor laser device that has been completed as a product.

Thus, since the absolute value of the difference between the first drive current and the second drive current is within 1.0 mA, the absolute value of the difference between the first drive current and the second drive current becomes a small one.

Accordingly, the drive current for the semiconductor laser chip is generally stabilized, so that the reliability of the semiconductor laser device is improved. Therefore, a semiconductor laser device of low cost free from characteristic variations can be realized.

Figure 11:
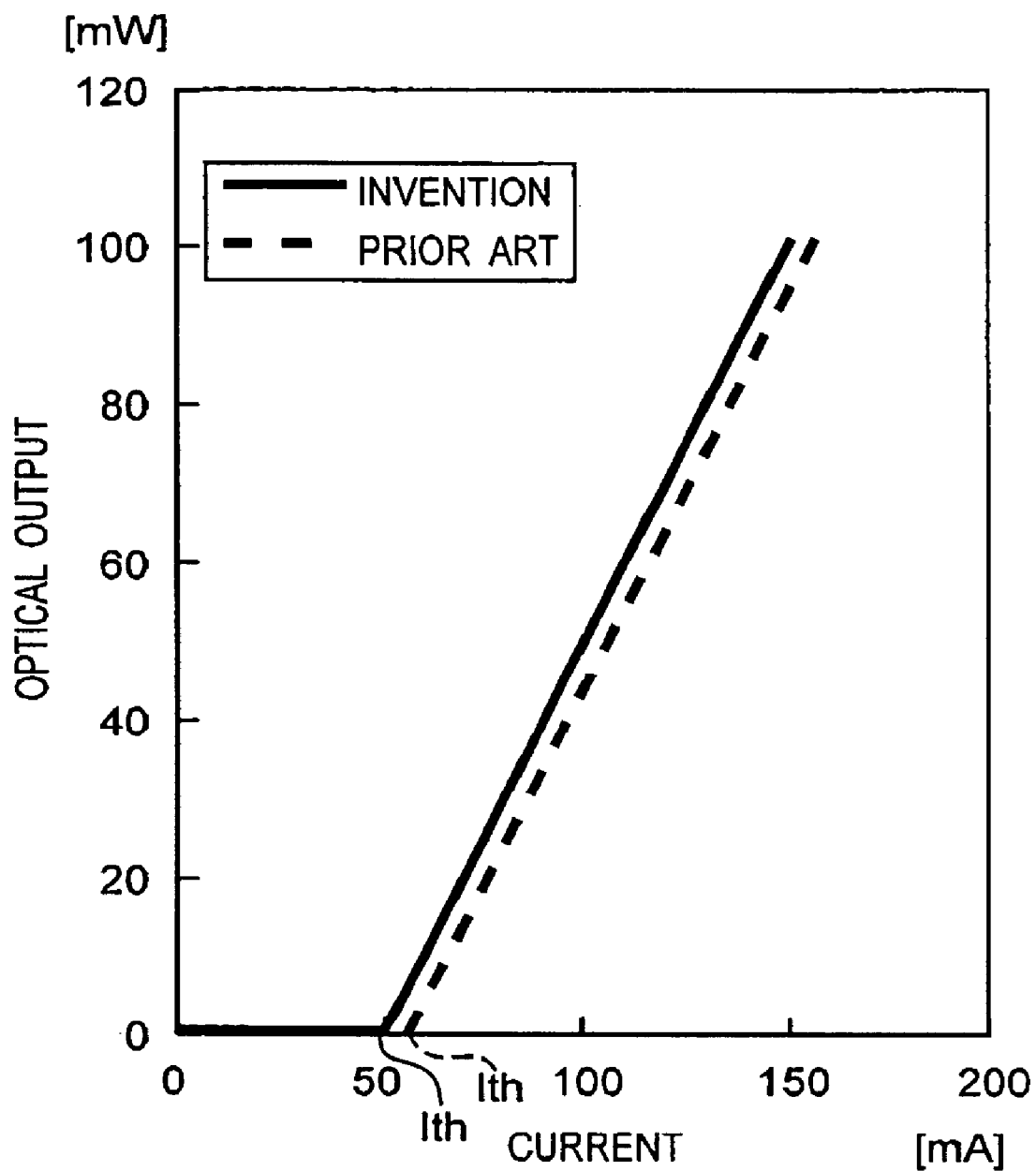
FIG. 11 is a graph showing a relationship between optical output and current in a semiconductor laser device of the invention and a semiconductor laser device of the prior art.

Also, as shown in FIG. 11, on the assumptions that the rated optical output of the semiconductor laser chip is 100 mW and that the atmospheric temperature is 25° C., a semiconductor laser device of the prior art that is not subjected to the first aging step S1 shows a threshold current Ith of about 58 mA, whereas the semiconductor laser device of the invention that has been subjected to the first aging step S1 shows a threshold current Ith of about 52 mA. Thus, in the present invention, the threshold current can be reduced and so the drive current can be reduced.

Figure 12:
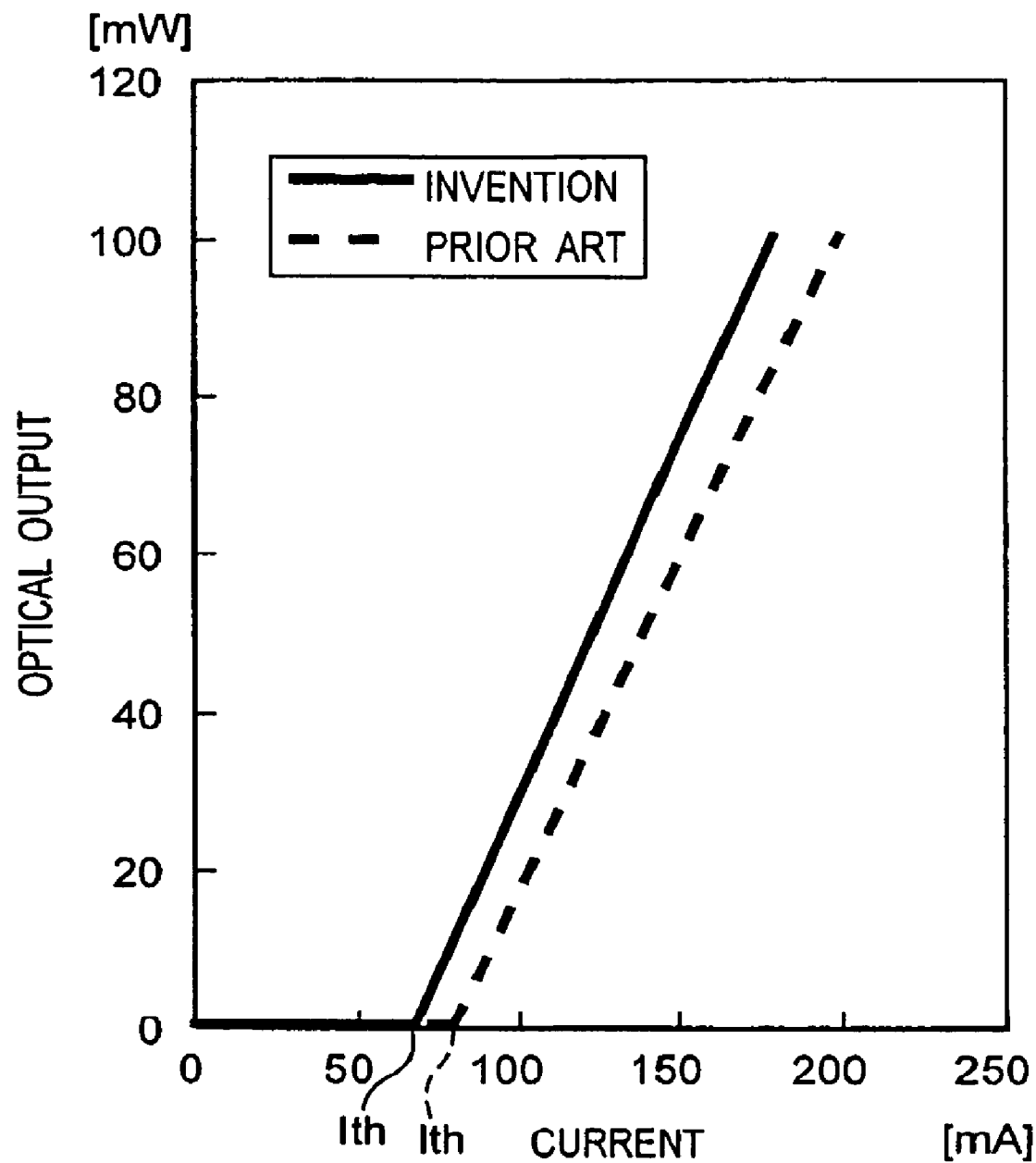
FIG. 12 is a graph showing a relationship between optical output and current in a semiconductor laser device of the invention and a semiconductor laser device of the prior art.
Figure 13:
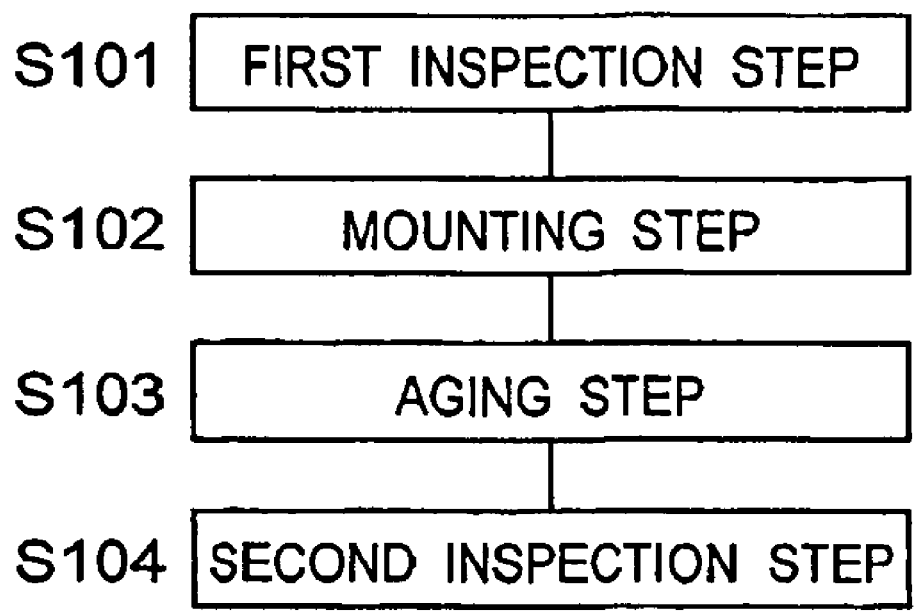
FIG. 13 is a flowchart showing a semiconductor laser device manufacturing method according to the prior art.

Also, as shown in FIG. 12, on the assumptions that the rated optical output of the semiconductor laser chip is 100 mW and that the atmospheric temperature is 70° C., a semiconductor laser device of the prior art that is not subjected to the first aging step S1 shows a threshold current Ith of about 80 mA, whereas the semiconductor laser device of the invention that has been subjected to the first aging step S1 shows a threshold current Ith of about 70 mA. Thus, in the present invention, the threshold current can be reduced and so the drive current can be reduced.

Also, the semiconductor laser chip is subjected to drive current conduction lasting for 0.5 second to 5 minutes at atmospheric temperatures of 170 to 300° C., which are not lower than storage temperature. Thus, electrical characteristics of the semiconductor laser chip such as reduction of threshold current and drive current have been improved with reliability.

Eighth Embodiment

A difference of this embodiment from the seventh embodiment lies in that, in the eighth embodiment, the ratio of the first drive current at a start of conduction to the second drive current immediately after a lapse of 20 hours after the start of the conduction is 98% to 102% in the state that the semiconductor laser chip produces a rated optical output immediately after the product completion after the mounting.

Thus, since the ratio ((Iop1/Iop2)×100) of the second drive current Iop1 to the first drive current Iop2 is 98% to 102%, variations of the first drive current and the second drive current are lessened.

Accordingly, the drive current for the semiconductor laser chip is generally stabilized, so that the reliability of the semiconductor laser device is improved. Therefore, a semiconductor laser device of low cost free from characteristic variations can be realized.

It is to be noted here that the present invention is not limited to the above-described embodiments. For example, the material of the semiconductor laser chip is indeed most preferably given by AlGaInP based ones, but may be GaInAsP-, AlGaAs-, AlGaInN-, GaInNAs-based ones or the like.

Also, the semiconductor laser device manufacturing method of the invention may include steps other than the first aging step S1, the first inspection step S2, the mounting step S3, the second aging step S4, the second inspection step S5 and the chipping step S6.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor laser device manufacturing method comprising:
   a first aging step for passing a direct current through a semiconductor laser chip for a set time period at a set atmospheric temperature not lower than a storage temperature;
   a first inspection step for inspecting at least one of threshold current and drive current of the semiconductor laser chip after the first aging step;
   a mounting step for mounting the semiconductor laser chip that has undergone the first aging step;
   a second aging step for, after the mounting step, passing a current through the semiconductor laser chip at an atmospheric temperature not lower than the storage temperature; and
   a second inspection step for inspecting at least one of threshold current and drive current of the semiconductor laser chip after the second aging step.

2. The semiconductor laser device manufacturing method as claimed in claim 1, wherein the set atmospheric temperature and the set time period are so set that the semiconductor laser chip substantially does not undergo a degradation phenomenon or an upgrade phenomenon after the first aging step.

3. The semiconductor laser device manufacturing method as claimed in claim 1, wherein the set atmospheric temperature is 170 to 300° C.

4. The semiconductor laser device manufacturing method as claimed in claim 1, wherein the set time period is 0.5 second to 5 minutes.

5. The semiconductor laser device manufacturing method as claimed in claim 1, wherein the first aging step is performed on the semiconductor laser chips of a laser bar which is composed of a plurality of the semiconductor laser chips which are arrayed.

6. A semiconductor laser device manufacturing method comprising:
   a first aging step for passing a direct current through a semiconductor laser chip for a set time period at a set atmospheric temperature not lower than a storage temperature;
   a mounting step for mounting the semiconductor laser chip that has undergone the first aging step;
   a second aging step, after the mounting step, for passing a current through the semiconductor laser chip at an atmospheric temperature not lower than the storage temperature; and
   an inspection step, after the second aging step, for inspecting at least one of threshold current and drive current of the semiconductor laser chip.

* * * * *